US012698557B2

(12) United States Patent
Imbault et al.

(10) Patent No.: US 12,698,557 B2
(45) Date of Patent: Aug. 4, 2026

(54) SOLAR HEATING FOR THIN FILM EVAPORATION AND DIRECTIONAL SOLIDIFICATION

(71) Applicant: Blue Origin Manufacturing, LLC, Huntsville, AL (US)

(72) Inventors: Alexander Imbault, Sierra Madre, CA (US); Jonathan Grandidier, Pasadena, CA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 0 days.

(21) Appl. No.: 18/342,961

(22) Filed: Jun. 28, 2023

(65) Prior Publication Data

US 2025/0003054 A1    Jan. 2, 2025

(51) Int. Cl.
| | |
|---|---|
| *B64G 99/00* | (2009.01) |
| *C01B 33/037* | (2006.01) |
| *C23C 14/16* | (2006.01) |
| *C23C 14/28* | (2006.01) |
| *C23C 14/54* | (2006.01) |
| *H10P 14/40* | (2026.01) |

(52) U.S. Cl.
CPC .............. *C23C 14/28* (2013.01); *B64G 99/00* (2022.08); *C01B 33/037* (2013.01); *C23C 14/16* (2013.01); *C23C 14/542* (2013.01); *H10P 14/416* (2026.01)

(58) Field of Classification Search
None
See application file for complete search history.

(56) References Cited

U.S. PATENT DOCUMENTS 3,999,950 A * 12/1976 Nagorsen ................ C30B 15/30
117/214
5,622,567 A * 4/1997 Kojima ............... C23C 14/3471
427/596

(Continued)

FOREIGN PATENT DOCUMENTS

KR        2013021844 A * 3/2013 ............. C23C 14/28

OTHER PUBLICATIONS

Blue Alchemist Technology Powers our Lunar Future, Blue Origin, Blog accessed at https://www.blueorigin.com/news/blue-alchemist-powers-our-lunar-future/, Feb. 10, 2023.

(Continued)

*Primary Examiner* — Jose I Hernandez-Kenney
(74) *Attorney, Agent, or Firm* — Summit Patents, PC

(57)        ABSTRACT

Configurations for solar heating and processing of a material, such as a metal or metalloid, are presented. Such processing may have an end-goal of purifying the material or depositing the material as a thin film on a substrate. The use of solar heating allows these processes to occur without electricity, which may be a scarce resource on the moon. Metals and metalloids derived from lunar regolith or other impure feedstocks may lead to materials with impurities. Generally, materials, such as silicon, need to be purified before being utilized. Techniques for solar heating may be applied to purification of these materials. Purification may be achieved by melting, via solar heating, and resolidifying slowly from one direction to another using a directional solidification process.

19 Claims, 4 Drawing Sheets

(56)                    References Cited

U.S. PATENT DOCUMENTS

| | | | |
|---|---|---|---|
| 6,150,995 A * | 11/2000 | Gilger | B64G 99/00 |
| | | | 343/915 |
| 12,612,690 B1 | 4/2026 | Ignatiev | |
| 2020/0191443 A1 * | 6/2020 | Garvey | G02B 27/0983 |
| 2022/0195589 A1 * | 6/2022 | Ignatiev | C23C 14/50 |
| 2023/0250529 A1 | 8/2023 | Ignatiev | |
| 2024/0328674 A1 * | 10/2024 | Sercel | F24S 23/79 |

OTHER PUBLICATIONS

Gordon, Pierce E.C. et al., "Thermal Energy for Lunar In Situ Resource Utilization: Technical Challenges and Technology Opportunities," 49th Aerospace Science Meeting, Orlando, Florida, Jan. 4-7, 2011.
Irina Apostol, et al., "Solar physical vapor deposition: A new approach for preparing magnesium titanate nanopowders," Applied Surface Science, v. 285, Nov. 15, 2013, pp. 49-55.

* cited by examiner

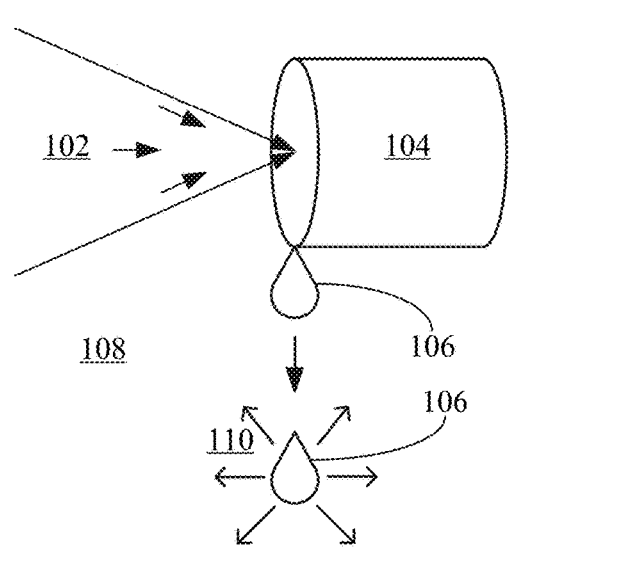
FIG. 1
FIG. 2
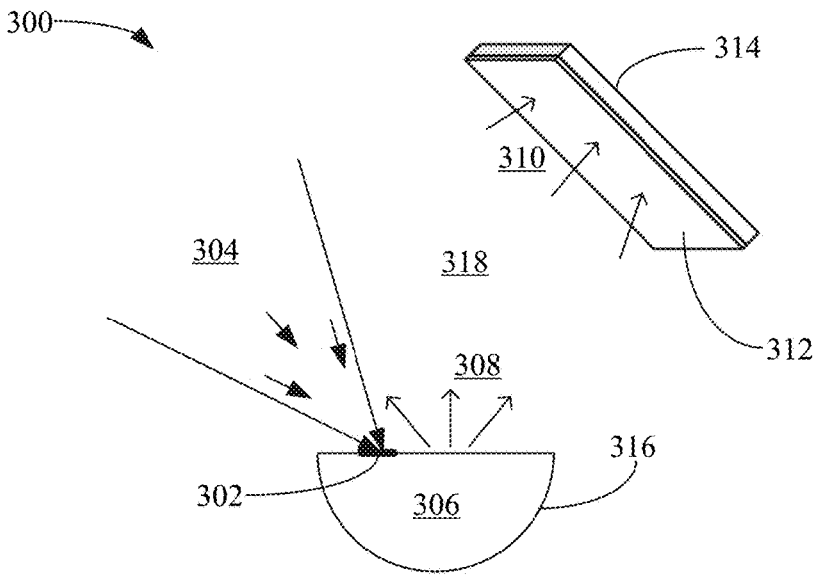
FIG. 3

SOLAR HEATING FOR THIN FILM EVAPORATION AND DIRECTIONAL SOLIDIFICATION

BACKGROUND

Fabrication of devices and processing of materials are generally energy-intensive operations. Most often, the form of energy is electricity. On Earth, there is an ever-increasing recognition that energy is a valuable resource to be conserved or used wisely. On the moon, availability of energy, such as electricity for use in fabrication or material processing, is presently limited to Earth-derived resources (e.g., fuel cells, batteries, etc.). Thus, providing electricity for fabrication or material processing on the moon may be challenging.

Silicon ingot fabrication may generally be a precursor to fabrication of solar cells, which may be used to provide electricity on the moon. Silicon ingot formation processes may face challenges to controlling grain structure, defect density, and impurities that will ultimately affect it's material properties. For example, the final grain structure and inherent structural defects, often associated with impurity distribution, in the ingot from it's manufacturing are generally responsible for photovoltaic properties of a solar cell. Impurities may play a major role as they not only can modify the development of the grain structure formation but can also interact with structural defects to create regions of deleterious minority carrier lifetime recombination in solar cells, for example.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 is a schematic view of concentrated sunlight incident on a bulk mass of material, according to some embodiments.

FIG. 2 is a schematic view of concentrated sunlight incident on material during a directional solidification process, according to some embodiments.

FIG. 3 is a schematic view of concentrated sunlight incident on a bulk mass of material leading to evaporation and condensation into a thin film, according to some embodiments.

DETAILED DESCRIPTION

Figure 4:
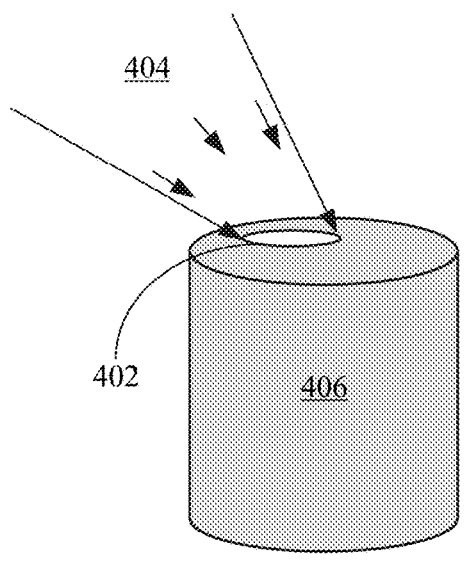
FIG. 4 is a schematic view of a spot of concentrated sunlight incident on a bulk mass of material, according to some embodiments.

This disclosure describes methods and configurations for solar heating and processing of a material, such as a metal or metalloid. Such processing may have an end-goal of purifying the material or depositing the material as a thin film on a substrate, for example. The use of solar heating allows these processes to occur without electricity, which may be a scarce resource on the moon.

Metals and metalloids derived from lunar regolith or other impure feedstocks may lead to materials with impurities. Generally, materials, such as silicon, need to be purified before being utilized (e.g., silicon for solar panels should be greater than 99.999% pure).

Techniques for solar heating may be applied to purification processes of these materials. For example, purification may be achieved by melting, via solar heating, and resolidifying slowly from one direction to another using a directional solidification process. This process generally causes macro-segregation of impurities and, consequently, purification of a material, such as a silicon ingot. Most of the impurities segregate to one part of the ingot, decreasing impurity concentrations in the remaining part, which becomes relatively purified.

Another technique for purification involves heating the material to create drops of the melted material falling through a vacuum so as to allow volatile materials to escape the drops. The vacuum may be naturally applied in a lunar environment, for example. The use of sunlight for heating can replace the use of electricity, which would otherwise power induction or resistive heating. Replacing or eliminating the use of electricity may be particularly beneficial for lunar or space applications.

Techniques for solar heating may also be applied to deposition of thin films onto a substrate. For example, silicon may be deposited, via condensation, as thin film layers (e.g., with thicknesses of hundreds of nanometers) using concentrated sunlight to evaporate or sublimate the silicon. In a particular embodiment, silicon is in a quartz crucible and concentrated sunlight is focused on the silicon, which heats to its melting temperature (1410° C.). Above its melting temperature, the silicon evaporates and subsequently deposits onto a substrate. Such a deposition process may allow for solar cell fabrication using concentrated sunlight. The use of sunlight for heating can replace the use of electricity, which would otherwise power a deposition process using an electron beam or thermal evaporation resulting from consuming tens to hundreds of kilowatts (e.g., 208 VAC, 100 A, 3-Ph).

In some embodiments, a solar heated material processor may include a support to hold a bulk mass of material and an optical assembly to collect sunlight and condense the sunlight to a focused, concentrated spot on the material. The bulk mass of material may be a solid ingot on a platform or a powder in a crucible, for example. The concentrated sunlight may heat and change the phase of the material, thus enabling the heated, phase-changed material to leave the bulk mass of material. The optical assembly may include optical elements, such as lenses and/or mirrors, described below. In some implementations, an optical assembly may be a parabolic solar reflector that is configured to track the movement of the sun across the sky (e.g., via stepper motors, etc.). A parabolic solar reflector may produce a focused beam of light that may be aimed onto a material for heating the material. The spot of concentrated sunlight may heat and vaporize the material. Instead of, or in addition to, a parabolic solar reflector, the optical assembly may include optical elements, such as lenses and/or mirrors, that are moveable to vary the location of the focused spot on the material. The solar heated material processor may also include a material collecting element to capture the heated, phase-changed material as it leaves the bulk mass of material.

In some implementations, the heated, phase-changed material is vaporized. The vaporized material may be collected via condensation on a semiconductor substrate, which may be silicon, for example. Thus, the condensed material may form a thin film. The vaporized material may be exposed to the vacuum of the moon while transiting to the semiconductor substrate. This exposure, of the semiconductor substrate and the bulk mass of material as well as the vaporized material, helps prevent impurities from adding into the condensing thin film.

In other implementations, the heated, phase-changed material is in a liquid phase, which may be collected into a container configured for directional solidification, for example. The liquid material may leave the bulk mass of material via drops that fall with gravity into the container. The drops may be exposed to the vacuum of the moon allowing volatile impurities to escape the drops. Thus, the action of falling drops in a vacuum is in itself a purification process.

In some embodiments, a method for solar heating and processing a material may include providing, via an optical assembly, a concentrated spot of sunlight onto a bulk mass of the material to heat and change the phase of the material to either a liquid or a vapor, thus enabling the heated, phase-changed material to leave the bulk mass of the material in response to the phase change. Relative positions of optical elements of the optical assembly may be changed to vary the location of the concentrated spot on the material. In the case of a vapor, the method may further include condensing the vaporized material onto a semiconductor substrate, such as silicon. In the case of a liquid, the method may further include collecting the heated, phase-changed material in a container configured for directional solidification.

FIG. 1 is a schematic view of concentrated sunlight 102 incident on a bulk mass of material 104, according to some embodiments. The direction and orientation of concentrated sunlight 102 and bulk mass of material 104, as well as its size and shape, are merely examples, and claimed subject matter is not so limited. Concentrated sunlight 102 may heat and melt material 104, creating drops 106 that fall away from the bulk mass with gravity. Drops 106, or other melted flow from the bulk mass, may be collected in a container configured for directional solidification, for example. In some implementations, the drops may be exposed to the vacuum 108 of the moon, allowing volatile impurities 110 to escape the drops. Accordingly, drops 106 collected in a container may have less impurities than drops just leaving the bulk mass. Subsequently, the melted, at least partially purified material in the container may be placed through a process of directional solidification for further purification.

FIG. 2 is a schematic view of concentrated sunlight 202 incident on material 204 during a directional solidification process, according to some embodiments. For example, material 204 may be held in a container 206 configured for directional solidification. The direction and orientation of concentrated sunlight 202 and bulk mass of material 204, as well as its size and shape, are merely examples, and claimed subject matter is not so limited. Concentrated sunlight 202 may melt material 204 to a liquid phase throughout the entire volume of container 206. During the directional solidification process, heat 208 may be allowed to escape at the bottom of the container (or at an end of the container opposite the end where concentrated sunlight 202 is incident on the material). This loss of heat may lead to solidification of the material starting at the bottom of the container, and relatively slowly travelling upward. This slow migration of solidification may transport impurities upward with the leading edge of the solidification. When all of material 204 has solidified in this fashion, the top region of the solid will contain most of the impurities that were previously dispersed throughout the material during the liquid phase. This process may be performed in the vacuum 210 of the moon.

FIG. 3 is a schematic view of a process 300 for thin film formation, according to some embodiments. In process 300, a spot 302 of concentrated sunlight 304 incident on a bulk mass of material 306 leads to evaporation 308 and condensation 310 into formation of a thin film 312 on a substrate 314 that is relatively cold compared to ambient vaporized material. For example, silicon may be deposited, via condensation, as a thin film layer. In this example, silicon may be in a crucible 316 (e.g., quartz) and concentrated sunlight 304 is focused onto the silicon, which heats to its melting or boiling temperature. Above its boiling temperature, the silicon evaporates, illustrated by arrows 308, and subsequently deposits, illustrated by arrows 310, onto substrate 314, which may also be silicon. The substrate and thin film may be used for solar cell fabrication. In some implementations, process 300 may be performed in a vacuum 318 of the moon. The direction and orientation of concentrated sunlight 304 and bulk mass of material 306, as well as its size and shape, are merely examples, and claimed subject matter is not so limited. One substrate (314) is illustrated for clarity, but multiple substrates may be included in process 300 to capture vaporized material.

FIG. 4 is a schematic view of a spot 402 of concentrated sunlight 404 incident on a bulk mass of material 406, according to some embodiments. This situation may be similar to or the same as those illustrated in FIGS. 1-3, for example. Heat from spot 402 principally heats the material in the spot. Diffusion of heat from the material in the spot may also heat surrounding material. The rate and extent to which diffusion heats the surrounding material may depend on the material, spot size, and the intensity of concentrated sunlight 404, among other things. As described below, in some implementations, processes of melting or evaporating material may involve varying the location, size, and or shape of spot 402 on the bulk mass of material. For example, such variations may allow for increasing uniformity of heating of the bulk mass of material. Such variations in spot size may also allow for changing the intensity of the concentrated sunlight. For the same quantity of incoming sunlight, a smaller spot size will provide heat that is more intense than that of a larger spot. Accordingly, varying the spot size may allow for controlling the rate of melting or vaporizing a material.

Figure 5:
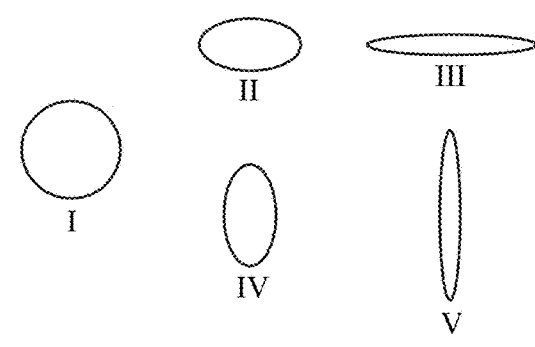
FIG. 5 illustrates various example embodiments of spots of concentrated sunlight.

FIG. 5 illustrates various example embodiments of spots of concentrated sunlight, which may represent the example spots illustrated in FIGS. 1-4. The various sizes and shapes of spots I-V may be formed by a series of lenses and/or mirrors placed between a material surface and the incoming sun rays. Shapes of the spots may be formed by spheric or aspheric lenses or mirrors or gradient-index lenses, for example.

Figure 6:
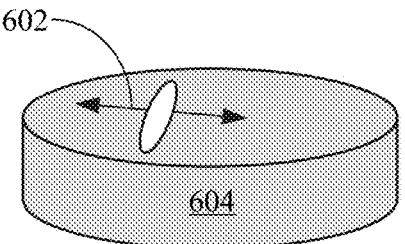
FIG. 6 is a schematic view of a spot of concentrated sunlight varying in location on a surface of material, according to some embodiments.

In addition to the circular and elliptical shapes, a concentrated sunlight spot may be substantially square or rectangular. Also, in addition to varying shapes, a process of heating a material may involve moving, from time to time or cyclically, the spot across the surface of the material. This is illustrated in FIG. 6. For example, the elongated spot III or V may be cyclically moved, represented by arrows 602, across a surface area of material 604 so that substantially all portions of the area are equally and uniformly heated.

Figure 7:
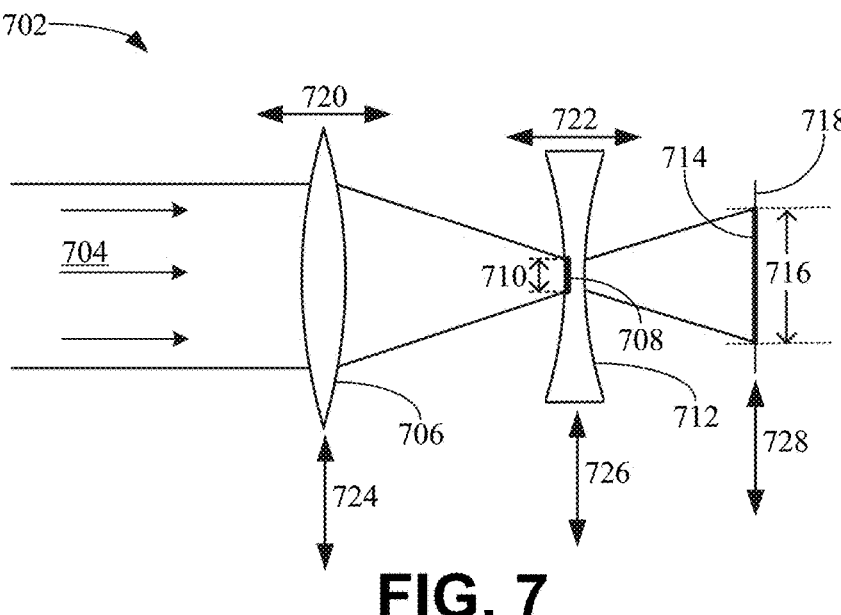
FIG. 7 is a schematic cross-section view of an optical assembly that includes moveable optical elements, according to some embodiments.

FIG. 7 is a schematic cross-section view of an optical assembly 702 that includes moveable optical elements, according to some embodiments. Such optical elements may be mirrors and or lenses. Though lenses are illustrated in the figure, some or all of the lenses may be replaced by mirrors. For example, spherical or aspherical mirrors may provide focus and collimation similar to or the same as corresponding lenses. Thus, claimed subject matter is not limited to lenses or mirrors in an optical assembly.

In the example illustrated in the figure, sunlight 704 is incident on a first optical element 706, which may be a convex lens. Sunlight 704 may be naturally collimated due to the large distance to the sun or may be a priori focused by one or more beam steering elements not illustrated. For example, such beam steering may arise from tracking the sun's movement across the sky. In some implementations, however, optical assembly 702, or a portion thereof, may be rotated to track the movement of the sun's position. First optical element 706 may focus and concentrate sunlight 704 to a spot 708 having a spot size 710. Spot 708 may be incident on a material for heating the material. In this case, optical assembly 702, as described thus far, is relatively simple, comprising a "single" lens (e.g., not to exclude the possible use of a compound lens) or mirror. Spot size 710 may be varied by changing the distance between the surface of the material and first optical element 706.

The addition of another lens (or mirror), however, may allow for techniques for varying the size and location of the concentrated sunlight spot without moving the material to be heated. For example, the addition of second optical element 712, which may be a concave lens, may produce a spot 714 having a size 716 larger than that of spot 708 (depending on the distance between the surface of the material and first optical element 706) on a material surface 718. Generally, the size of the spot depends on the relative distances between first and second optical elements and material surface 718. Accordingly, the relative locations of the optical elements may be moved, represented in the figure by arrows 720 and 722, respectively, to vary the size of the spot (e.g., 708 or 714).

In addition to changing their relative distances apart, the optical elements may be moved transversely off axis, as represented in the figure by arrows 724 and 726, to vary the location of the concentrated sunlight spot on the surface of the material. For example, movement of second optical element in a direction 726 may lead to spot 714 changing location, indicated by arrow 728, on material surface 718.

In some embodiments, though not illustrated, optical assembly 702 may include an optical shutter that may be used to regulate the amount of concentrated sunlight (e.g., heat) incident on a material to be heated. For example, such an optical shutter may open and close cyclically or from time-to-time, wherein a closed shutter blocks incident sunlight and an opened shutter allows incident sunlight to impinge on the material. The shutter may be opened and closed via one or more motion transducers, similar to or the same as what may be used to move any of the optical elements in optical assembly 702.

Generally, electromagnetic energy in the ultraviolet (UV) through the infrared (IR) spectrum is transmitted, reflected, and/or absorbed by optical elements. Energy that is absorbed by an optical element contributes to heating the optical element. Because optical elements included in optical assembly 702 are receiving sunlight, and because some of the elements are receiving at least partially condensed, high-intensity sunlight, even a relatively small percentage of absorption may detrimentally affect these optical elements due to relatively high heat input. Accordingly, in some embodiments, the relatively cold environment in shadowed areas of the moon may be used to maintain relatively cool temperatures of the optical elements. For example, while portions of the optical elements in the optical path of the sunlight may heat due to absorption, cold portions of the optical elements outside the optical path (e.g., edge portions of the optical elements) where sunlight is blocked (e.g., shadowed areas) may draw the heat away from the optical path portions of the elements. In some implementations, radiative heat sinks may be attached to optical elements outside the optical path.

Figure 8:
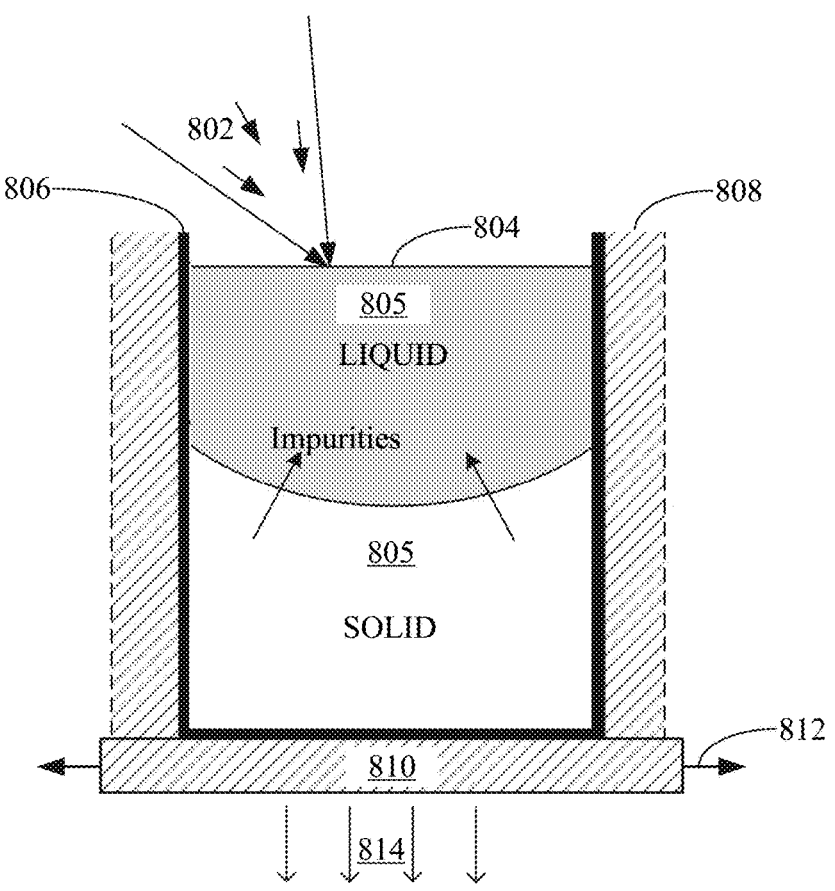
FIG. 8 is a schematic cross-section view of concentrated sunlight incident on material during a directional solidification process, according to some embodiments.

FIG. 8 is a schematic cross-section view of concentrated sunlight 802 incident on a surface 804 of material 805 during a directional solidification process, according to some embodiments. The material, which may be silicon, for example, may be in a container 806 configured for directional solidification. For example, container 806 may be covered with thermal insulation 808. In some implementations, a bottom portion of container 806 may be covered by a thermal insulator panel 810 that is moveable, as indicated by arrows 812. This configuration can allow for controlling the rate of heat flow from material 805 to the cold exterior (e.g., the moon) of container 806. Controlling the rate (and direction) of heat flow may in turn determine the rate (and direction) of material solidification, which tends to drive impurities in material 805 upward, as illustrated in the figure. In some implementations, the bottom of container 806, and thermal insulator panel 810, are nearest to the cold of the moon. Interestingly, the top of container 806 may receive concentrated sunlight (e.g., 802) leading to temperatures that can melt material 805. On the other hand, in the shadow of container 806, on the moon, temperatures may be very cold, thus assisting in pulling heat 814 from bottom portions of material 805, particularly if thermal insulator panel 810 is moved away from the bottom of container 806.

Figure 9:
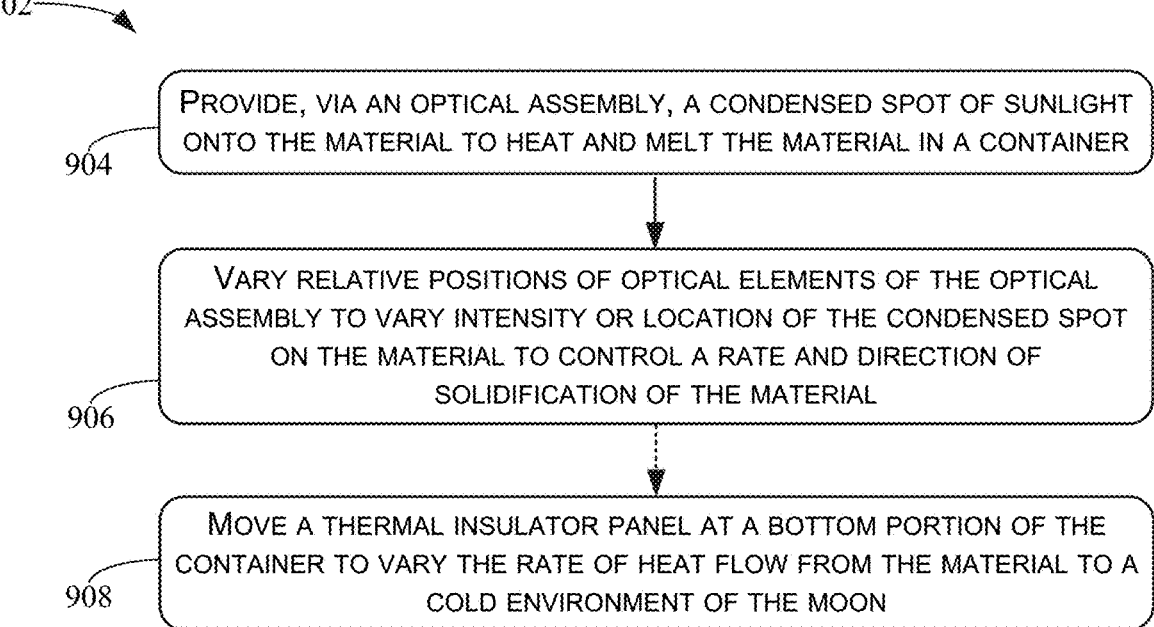
FIG. 9 is a flow diagram of a process of solar heated directional solidification of a material, according to some embodiments.

FIG. 9 is a flow diagram of a process 902 of solar heated directional solidification of a material, according to some embodiments. Process 902 may be performed by an operator that is human, a computer processor performing executable electronic instructions, or a combination of both At 904, an operator may provide, via an optical assembly, a spot of concentrated sunlight onto the material to heat and melt the material in a container. For example, optical assembly 702 may be used to place such a spot that is similar to or the same as spots illustrated in FIG. 5. At 906, the operator may vary relative positions of optical elements (e.g., lenses, mirrors, etc.) of the optical assembly to vary intensity or location of the spot of concentrated sunlight on the material to control a rate and direction of solidification of the material. For example, a small spot may provide relatively intense heat to a small area of material surface, whereas a larger spot may provide less intense heat over a larger area of the material surface. At 908, the operator may move a thermal insulator panel, such as 810, at a bottom portion of the container to vary the rate of heat flow from the material to a cold environment of the moon. Thus, the operator, by varying the intensity or location of the spot of concentrated sunlight on the material, and by varying the rate of heat flow from the material to a cold external environment, may balance heat input at the top of the material with heat output at the bottom of the material to perform directional solidification of the material.

Figure 10:
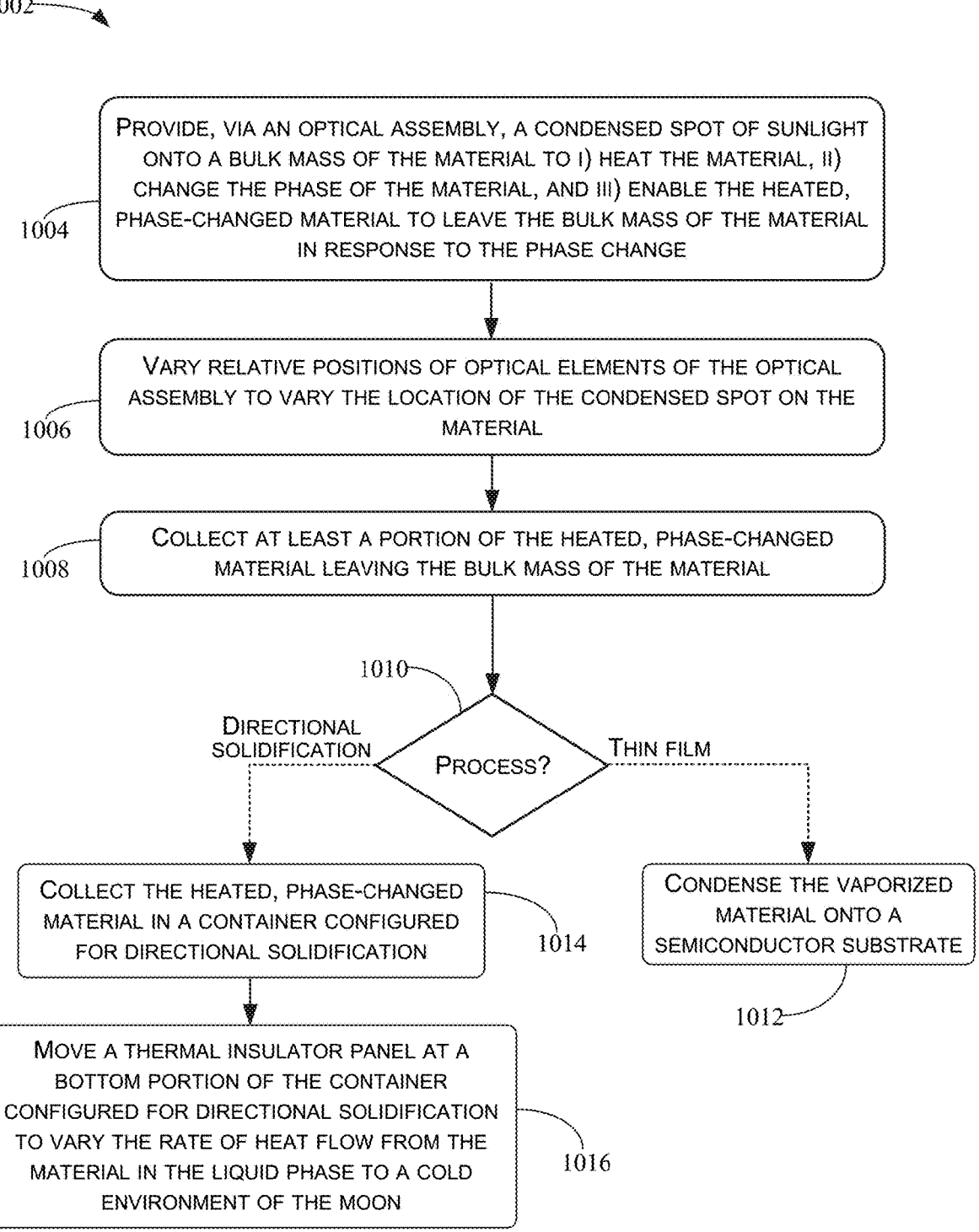
FIG. 10 is a flow diagram of a process of solar heating and processing a material, according to some embodiments.

FIG. 10 is a flow diagram of a process 1002 of solar heating and processing a material, according to some embodiments. As for process 902, process 1002 may be performed by an operator that is human, a computer processor performing executable electronic instructions, or a combination of both.

At 1004, an operator may provide, via an optical assembly, a concentrated spot of sunlight onto a bulk mass of the material to i) heat the material, ii) change the phase of the material, and iii) enable the heated, phase-changed material to leave the bulk mass of the material in response to the phase change. At 1006, the operator may vary relative positions of optical elements of the optical assembly to vary the location of the spot of concentrated sunlight on the material. At 1008, the operator may collect at least a portion of the heated, phase-changed material leaving the bulk mass of the material. At 1010, a determination may be made as to which subsequent process the material is to undertake. For example, if the subsequent process is to form a thin film, then process 1002 proceeds to 1012, where the operator may condense the heated, phase-changed material, being a vapor, onto a semiconductor substrate. On the other hand, if the subsequent process is directional solidification, then process 1002 proceeds to 1014, where the operator may collect the heated, phase-changed material, being a liquid, in a container configured for directional solidification. At 1016, the operator may move a thermal insulator panel (e.g., 810) at a bottom portion of the container configured for directional solidification to vary the rate of heat flow from the material in the liquid phase to a cold environment of the moon.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are shown and described in order to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

We claim as follows:

1. A method for solar heating and processing a material, the method comprising:

providing, via an optical assembly, a spot of concentrated sunlight onto a bulk mass of the material to i) heat the material, ii) change the phase of at least a portion of the material to a liquid phase, and iii) enable the heated, phase-changed material to leave the bulk mass of the material in response to the phase change;

varying relative positions of optical elements of the optical assembly to vary the location of the spot of concentrated sunlight on the bulk mass of the material; and collecting at least a portion of the heated, phase-changed material leaving the bulk mass of the material in a container configured for directional solidification.

2. The method of claim 1, wherein the heated, phase-changed material in the liquid phase is exposed to the vacuum of the Moon while transiting from the bulk mass of the material to the container configured for directional solidification.

3. The method of claim 1, further comprising moving a thermal insulator panel at a bottom portion of the container configured for directional solidification to vary the rate of heat flow from the material in the liquid phase that is in the container to a cold environment of the Moon.

4. The method of claim 1, wherein the heated, phase-changed material forms droplets that fall through a vacuum before being collected in the container configured for directional solidification, thereby releasing volatile impurities from the droplets.

5. The method of claim 1, wherein the concentrated sunlight forms a spot that is rectangular, elliptical, or elongated in shape, and wherein the method further comprises cyclically moving the spot across a surface of the bulk mass of the material to provide substantially uniform heating.

6. The method of claim 1, wherein the optical assembly comprises at least two optical elements moveable relative to one another to vary a size of the concentrated sunlight spot on the bulk mass of the material.

7. The method of claim 6, wherein varying the relative positions of the optical elements varies an intensity of the concentrated sunlight on the bulk mass of the material.

8. A method for solar heating and processing a material, the method comprising:

providing, via an optical assembly, concentrated sunlight onto a surface of a bulk mass of the material to heat and change the phase of a first portion of the material to a liquid phase;

responsive to heating and changing the phase of the first portion of the material, enabling the heated, phase-changed material to leave the bulk mass of the material;

changing relative positions of optical elements of the optical assembly to vary location and/or intensity of the concentrated sunlight on the material; and collecting at least a part of the first portion of the material leaving the bulk mass of the material in a container configured for directional solidification.

9. The method of claim 8, wherein the collecting is performed in the natural vacuum environment of the Moon.

10. The method of claim 8, wherein the first portion of the material is exposed to the vacuum of the Moon while transiting from the bulk mass of the material to the container configured for directional solidification.

11. The method of claim 8, further comprising moving a thermal insulator panel to vary the rate of heat flow from the collected material in the container to a cold environment of the Moon.

12. The method of claim 8, wherein the container is configured for directional solidification by enabling the material in the liquid phase to solidify from a bottom portion of the container toward a top surface of the material in the liquid phase.

13. The method of claim 8, wherein the material includes impurities that originated from lunar regolith.

14. The method of claim 8, wherein the bulk mass of the material is a solid ingot or a powder.

15. A method for solar heating and processing a material, the method comprising:

providing, via an optical assembly, concentrated sunlight onto a surface of a bulk mass of the material to heat and change the phase of at least a portion of the material to a liquid phase;

responsive to heating and changing the phase of the material to a liquid phase, enabling the liquid phase material to leave the bulk mass of the material;

collecting the liquid phase material leaving the bulk mass of the material in a container configured for directional solidification; and moving a thermal insulator panel to vary the rate of heat flow from the collected liquid phase material in the container to a cold environment surrounding the container.

16. The method of claim 15, wherein the cold environment surrounding the container is a lunar environment of the Moon.

17. The method of claim 15, wherein the container configured for directional solidification includes a moveable thermal-insulator panel at a bottom portion of the container, and moving the thermal-insulator panel varies a rate of heat flow from the collected liquid-phase material to a cold environment surrounding the container.

18. The method of claim 15, further comprising coordinating variation of an intensity or location of the concentrated sunlight with movement of the thermal-insulator panel to maintain a substantially steady solidification rate of the liquid-phase material.

19. The method of claim 15, wherein the optical assembly includes an optical shutter operable to intermittently block and unblock concentrated sunlight incident on the material.

* * * * *